United States Patent [19]

Brady et al.

[11] Patent Number: 5,360,752

[45] Date of Patent: Nov. 1, 1994

[54] METHOD TO RADIATION HARDEN THE BURIED OXIDE IN SILICON-ON-INSULATOR STRUCTURES

[75] Inventors: Frederick T. Brady, Chantilly; Nadim F. Haddad, Oakton, both of Va.

[73] Assignee: Loral Federal Systems Company, Bethesda, Md.

[21] Appl. No.: 142,030

[22] Filed: Oct. 28, 1993

[51] Int. Cl.$^5$ ............................................. H01L 21/76
[52] U.S. Cl. ........................................ 437/62; 437/21; 437/24; 437/26; 437/974; 437/938; 437/959; 437/941; 148/DIG. 12
[58] Field of Search .................. 437/62, 11, 21, 24, 437/26, 974, 938, 959, 941; 148/DIG. 12

[56] References Cited

U.S. PATENT DOCUMENTS

| | | | |
|---|---|---|---|
| 3,935,033 | 1/1976 | Bauerlein et al. | 437/938 |
| 4,634,473 | 1/1987 | Swartz et al. | 148/DIG. 82 |
| 4,965,213 | 10/1990 | Blake | 437/21 |
| 5,013,681 | 5/1991 | Godbey et al. | 437/62 |
| 5,021,359 | 6/1991 | Young et al. | 437/63 |
| 5,024,965 | 6/1991 | Chang et al. | 437/62 |
| 5,034,335 | 8/1991 | Widdershoven | 437/63 |
| 5,066,993 | 11/1991 | Miura et al. | 357/23.7 |
| 5,137,837 | 8/1992 | Chang et al. | 437/21 |
| 5,185,280 | 2/1993 | Houston et al. | 437/44 |

OTHER PUBLICATIONS

McKitterick et al., "Total Dose Hardness of Bonded SOI Wafers", IEEE Trans. on Nuclear Science, vol. 39, No. 6, Dec. 1992, 2098–102.

Stahlbush et al., "Electron and Hole Trapping in Irradiated SIMOX, ZMR and BESOI Buried Oxides", IEEE Trans. on Nuclear Science, vol. 39, No. 6, Dec. 1992, pp. 2086–2138.

Boesch, Jr. et al., "Time Dependent Radiation-Induced Charge Effects in Wafer-Bonded SOI Buried Oxides", IEEE Trans. on Nuclear Science, vol. 39, No. 6 Dec. 1992, pp. 2103–2113.

*Primary Examiner*—Tom Thomas
*Assistant Examiner*—Trung Dang
*Attorney, Agent, or Firm*—Mark A. Wurm

[57] ABSTRACT

A method of forming a radiation hardened SOI structure is disclosed. The buried oxide layer of an SOI structure is hardened prior to the bonding of a device wafer which forms the silicon portion of the silicon-on-insulator. The radiation hardening is done by implantation of recombination center-generating impurities. All the radiation hardening is done prior to the bonding of the device silicon layer and allows for radiation hardening of the buried oxide layer of an SOI structure without any damage to the silicon device layer.

8 Claims, 4 Drawing Sheets

METHOD TO RADIATION HARDEN THE BURIED OXIDE IN SILICON-ON-INSULATOR STRUCTURES

BACKGROUND OF THE INVENTION

1. Field of the Invention

This invention relates to silicon-on-insulator (SOI) structures, and more particularly, to radiation hardening of integrated circuits build upon SOI structures.

2. Background Description

Much work has been spent developing integrated circuits based on silicon-on-insulator technology. The SOI structure of a very thin silicon film on an insulating substrate, shown in FIG. 1, results in advantages such as faster circuit speeds, reduced power consumption, and smaller circuits.

Although SOI technology has these many advantages, it is at a disadvantage relative to bulk silicon for hardness against total dose radiation. The presence of the buried insulator layer creates an additional oxide that must be hardened. As a result of its thickness, sufficient amounts of positive charge are trapped in the insulator following total dose radiation. The charge accumulation results in increased device leakage and threshold voltage shifts.

A method to radiation harden bulk silicon devices is disclosed in U.S. patent application Ser. No. 06/393,012 filed Jun. 28, 1982 to Edenfeld et al., entitled "Method to Improve Radiation Hardness of Field Oxide". This application is commonly assigned to the same owner as the present application, the teaching of which are herein incorporated by reference. What would be desirable, is a method whereby an SOI structure can be formed such that the buried oxide traps only a very low net negative charge after total dose radiation exposure. In hardening SOI structures for total dose applications, two variations of the SOI structure need to be considered, a thin film fully depleted (FD) structure and a thick film SOI structure being partially depleted (PD). The difference between the FD and PD, is that when the FD transistor is turned off, the depletion regions formed by the transistor gate and buried oxide overlap, depleting the entire silicon film and the transistor body. In partially depleted transistors, these regions do not overlap, thus, leaving a neutral region in the body. As a result of these differences, charges generated in the buried oxide are reflected proportionally in the transistor gate in fully depleted transistors but not in partially depleted transistors. For both transistors, charges in the buried oxide attract carriers to the body/buried oxide interface. When sufficient carriers are attracted to the interface, a parasitic conductive path is formed, resulting in increases in the transistor leakage. Due to the softness of conventional buried oxides, this leakage path occurs at very low radiation dosages, making it difficult to use fully depleted SOI technology in applications requiring radiation hardened electronics (e.g., missiles, nuclear reactors).

Several methods of improving the useful total radiation dose for SOI circuits are known. These techniques include the use of thicker silicon films and employing thinner buried oxides. As described above, the use of thicker silicon films improves the total dose hardness because the film is only partially depleted. Thus, the gate charge is not coupled to the buried oxide charge. Furthermore, with a thicker silicon film, the parasitic back channel leakage can be reduce by the use deep, high dosage ion implantation. It is very difficult to obtain sufficiently steep implant profiles with very thin silicon films. Additionally, this approach has the significant drawback that the body of the transistor is neutral and has a floating electrical potential. This results in the turn-on of the parasitic bipolar transistor formed by the source/body/drain of the device. To minimize the leakage caused by the transistor, the body of the transistor must be grounded either by a separate contact, or by a strap to the source. However, this results in a technology that is not compatible with bulk VLSI designs. Furthermore, many of the benefits of SOI, such as high transconductance, sharp transistor turn-on slopes and circuit density improvements are lost with partially depleted SOI.

Another potential hardening approach is to use thinner buried oxides. However, in fully depleted structures, the front gate threshold voltage is capacitively coupled to the buried oxide. Thus, thinning the buried oxide reduces the amount of charge that it traps, however, its capacitance goes up proportionally. Thus, essentially the same voltage shift in seen by the front gate.

What is needed, is a means to dope the buried oxide layer so as to produce a large number of recombination centers, such that the net trapped charge after total dose radiation is zero. An approach of implanting impurities into the SOI structure after it has been fabricated results in the amorphizing of the entire silicon film in order to implant the required energy and dose to form the recombination centers. The use of different insulating layers, such as an oxynitride layer doesn't work because it is difficult to form and control.

SUMMARY OF THE INVENTION

It is an object of the present invention to provide an improved silicon-on-insulator fabrication process providing radiation hardened buried oxide.

It is another object of the invention to provide a SOI process by which the structure is suitable for fully depleted devices.

It is yet another object of the invention to provide an improved SOI fabrication process fully compatible with present CMOS semiconductor fabrication technology.

It is a further object of the invention to provide a SOI fabrication process which does not affect the properties of the silicon film by increasing the defect level or changing the background doping levels.

These and other objects of the invention are realized in a process of forming a thin SOI structure having a hardened oxide. The method includes forming an oxide upon a handle wafer and hardening this oxide using ion implantation processing, bonding the handle wafer to a second wafer containing device silicon at low temperatures, then performing a sequence of grinds, polishes, and etches to thin the device wafer down to the desired thickness. The use of a continuous buried oxide makes the inventive process suitable for generic SOI circuits. Performing the hardening process on the oxide before it has a silicon device layer covering it allows the buried oxide to be hardened without affecting the properties of the silicon device layer. Using the wafer bonding method of forming SOI wafers permits the oxide to be hardened prior to being covered by a silicon film.

The disadvantages of the prior art approaches are eliminated. Since the buried oxide is total dose hardened, fully depleted transistors can be used eliminating the problems encountered with thicker partially depleted silicon films. In addition, hardening the buried oxide before adding the device silicon layer, eliminates the problems encountered when trying to alter the buried oxide properties by implanting through the silicon film. Since oxynitrides are not used, the small improvement and lack of consistency of oxynitrides is avoided. The process is fully compatible with standard production semiconductor processing techniques.

BRIEF DESCRIPTION OF THE DRAWINGS

The objects, features and advantages of the invention will be more fully appreciated with reference to the accompanying Figures.

DESCRIPTION OF THE PREFERRED EMBODIMENT

Figure 1A:
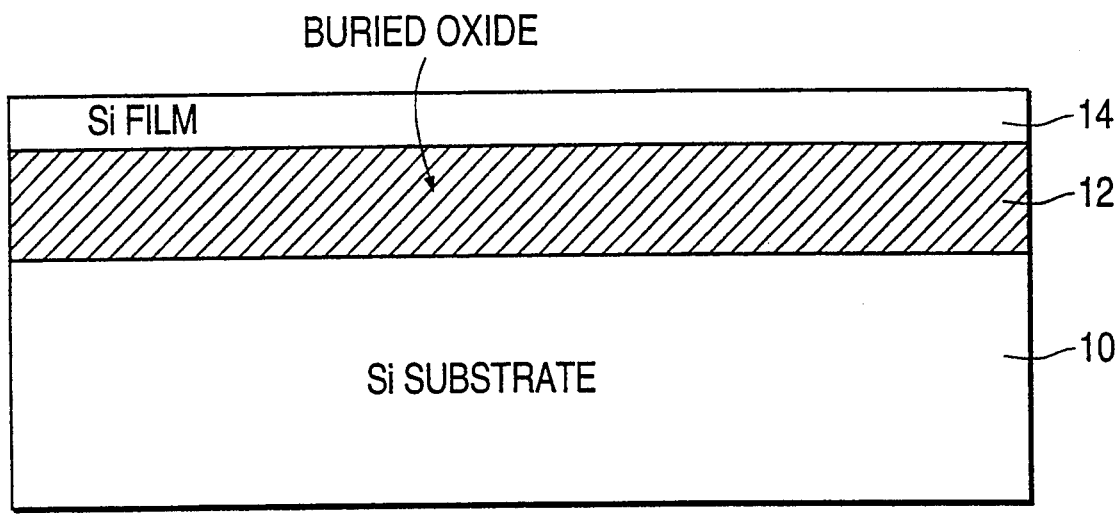
FIG. 1A and B show a basis SOI wafer structure and completed semiconductor devices thereon.

Shown on FIG. 1A is the basic SOI structure. The silicon substrate 10 has a buried oxide region 12 on which a thin film of silicon 14 is formed. The silicon film can be of a thickness of approximately 1000 Angstroms. It is in layer 14 that active devices will be formed on the SOI structure.

Figure 1B:
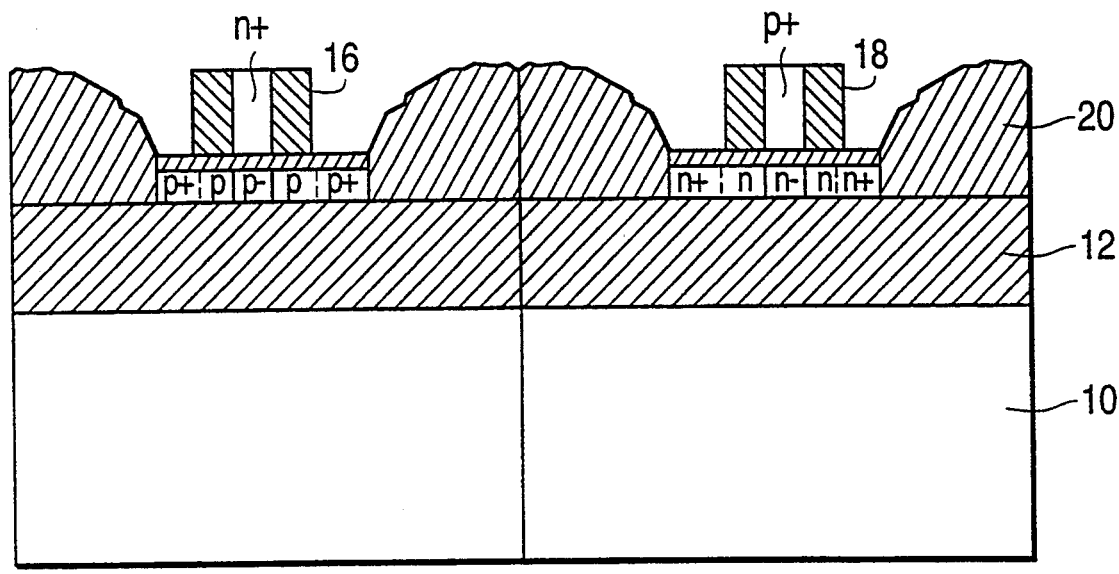

In FIG. 1B, active devices have been formed upon the SOI structure here containing a p channel transistor 16 and n channel transistor 18 which together can be a CMOS circuit. Isolating oxide 20 has been formed using LOCOS processing on the silicon film 14. It should be understood that the use of LDD drain engineering and LOCOS isolation is for example only, and that the invention is not limited to a particular drain engineering or lateral isolation approach.

The detailed processing steps for fabricating radiation hardened SOI wafers is shown FIGS. 2A-F. The critical steps are the oxide treatment and processing temperatures. Starting with FIG. 2A, a bulk silicon wafer 40, is shown. This wafer will become the handle or carrier substrate for the inventive process. The bulk silicon wafer 40 must be cleaned by conventional techniques prior to any processing, such as growing of a wet oxide, shown in FIG. 3B. This oxide layer 42 can be in the neighborhood of 4000 Angstroms, but varies in scale according to the desire gate length of the transistor to be formed. The oxide is grown using standard pyrogenic techniques.

Next, the wet oxide layer 42 which will become the buried oxide layer of the SOI structure is implanted with a deep recombination center generating species, such as geranium or arsenic. It is desirable that two implants, a deep implant shown in FIG. 2C be followed by a shallow implant, shown in FIG. 2D. It is desirable to form a uniform recombination center profile within the buried oxide layer 42. Examples of implant energies and dosage levels for the deep implant are 500 kV and 5E14 to 2E15 atoms/cm−2. While the shallow implant of recombination center generating impurities 46, can be of similar species at 180 kV and 1E15 atoms/cm−2.

Figure 2A:
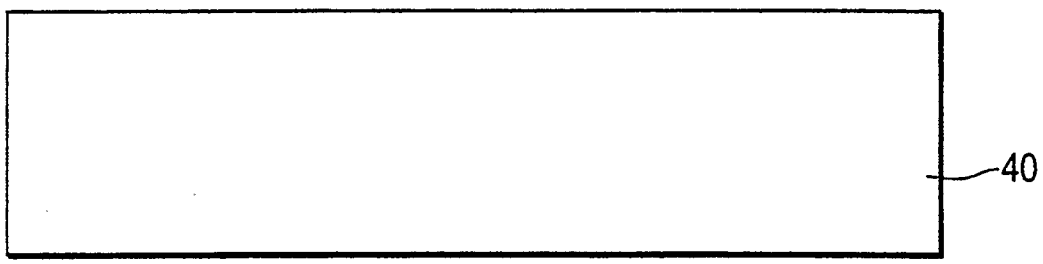
FIGS. 2A-F illustrate the process steps of the present invention.
Figure 2B:
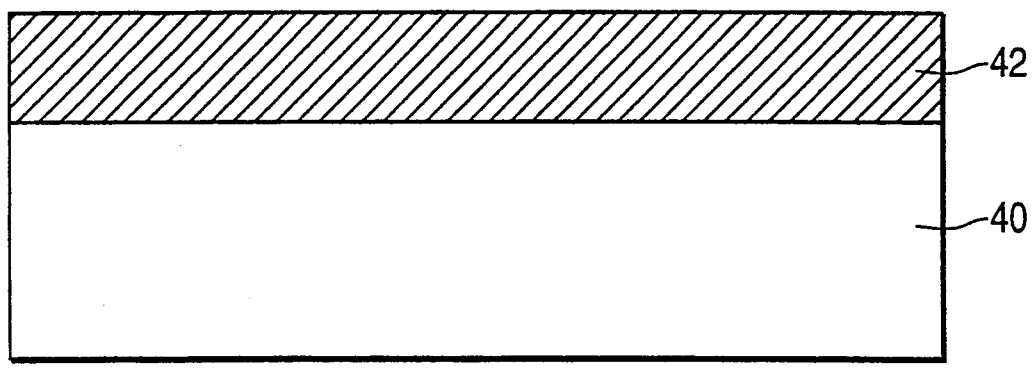
Figure 2C:
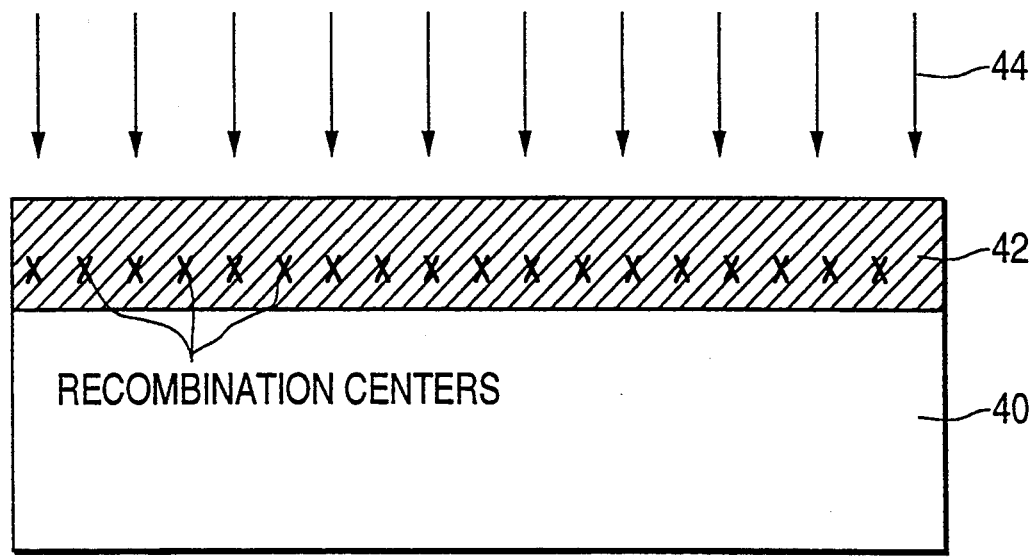
Figure 2D:
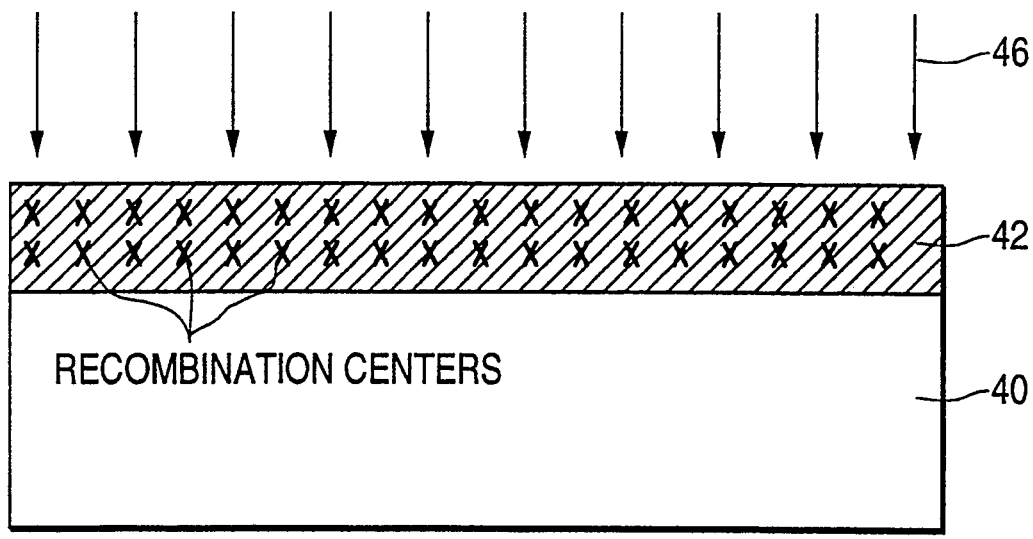
Figure 2E:
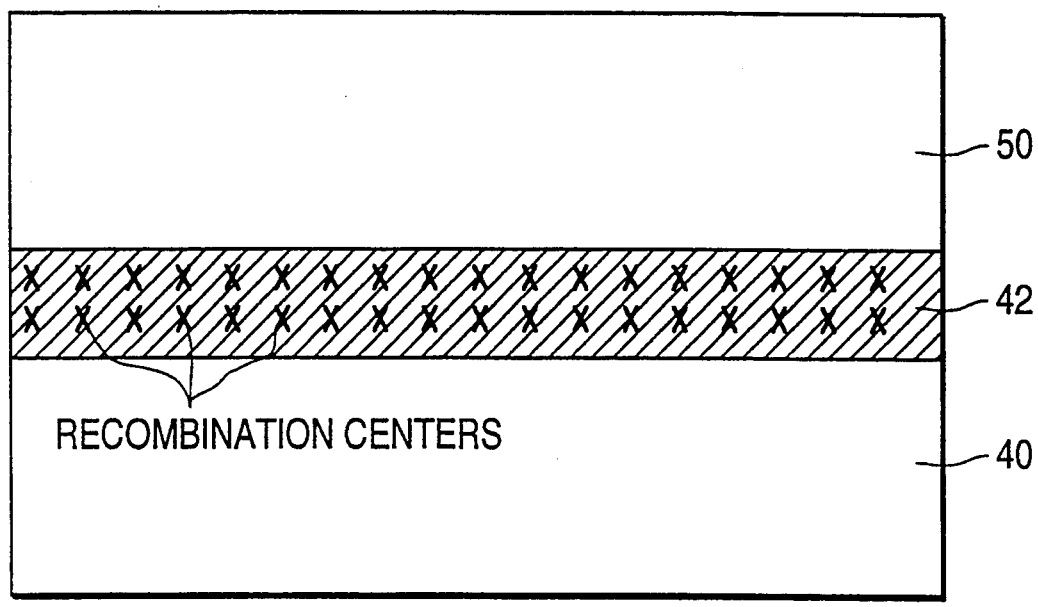

Once the recombination centers have been implanted into the oxide layer 42, the handle wafer comprising substrate 40 along with oxide layer 42 is thoroughly cleaned to remove any particles and great care is to maintain the surface as clean as possible. The oxide side of the handle wafer 40 is bonded to a clean silicon surface of a device wafer 50. The bonded wafers are annealed at temperatures less than 800° C. in an oxygen ambient to form a continuous silicon oxide silicon interface, as shown in FIG. 2E.

Figure 2F:
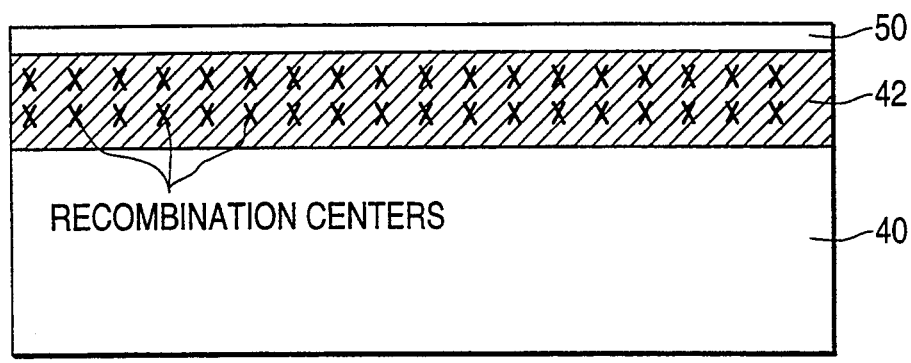

To compete the formation of the radiation hardened SOI structure, the device wafer 50 is mechanically ground, polished and etched back to the desired thickness to form the radiation hardened SOI structure of FIG. 2F.

Cleanliness of the handle wafer before bonding is of the utmost importance. It is necessary to eliminate particles as well as any contaminate from the wafer surfaces. The wafers must be cleaned with an approach that does this, such as in a high frequency cleaning process using a megasonic cleaner. Any particles on the wafer surface will produce a rough wafer surface and degrade the bond quality or cause voids. The oxide must then be grown immediately after cleaning.

Another critical parameter is the implant energy. The number of implants as well as implant energy required depends on the oxide thickness. The goal is to effect a high percentage of the oxide with emphasis on the oxide that is nearer the device silicon 50 interface. For the current 4000 Angstrom oxide, this leads to two separate implants to cover sufficient depth. Thinner oxide may need only one implant. Another consideration is that the shallow implant can not be to shallow. A excessively shallow implant facilitates outgassing the oxide during the bonding of the handle wafer and the device wafer. This outgassing facilitates a formation of gas bubbles between the two wafers instead of a smooth continuous interface. When the device wafers is thinned down sufficiently, the silicon in these areas is not longer strong enough to contain the bubbles and may result in miniature explosions and a loss of silicon in these areas.

The post bonding anneal of the wafers must be done at a low temperature. Annealing at higher temperatures will reduce the total dose radiation hardness of the buried oxide. Since lower temperature bonds are more sensitive to particles and contamination at the bonding interface, the wafers must be carefully cleaned in the steps prior to bonding.

While the method used to thin the device wafers down to its final thicknesses is important for achieving a uniform silicon thickness, it is not important for achieving radiation hardened buried oxide. Thus, any technique can be used, such as precision grinding, use of highly selective chemical etches or local plasma etching.

Figure 3:
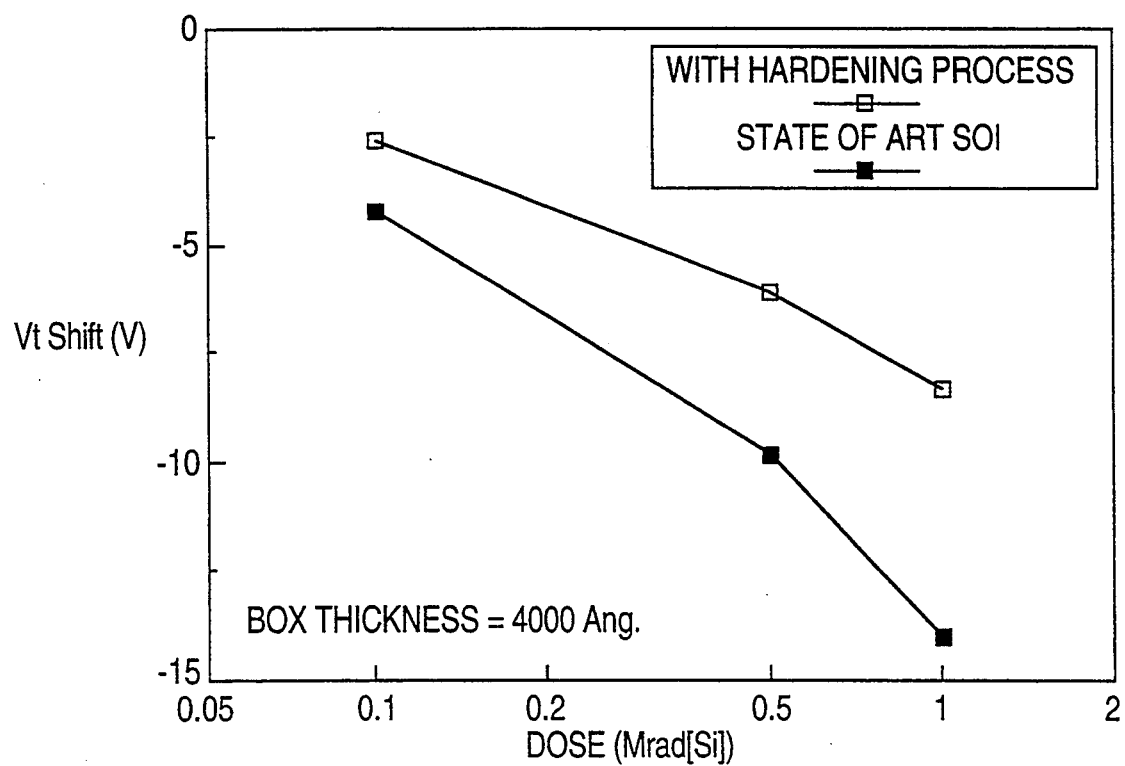
FIG. 3 shows test data results of using the present invention.

Shown in FIG. 3 is the threshold voltage shift versus total radiation dose curves for the improved process of the present invention versus the state of the art SOI processing. Clear improvement is shown for the inventive technique.

In the following Table is a comparison is shown between the process and the typical state of the art SOI wafers produced from separation by implantation of oxygen (SIMOX) process. Forty percent improvement at a total dose one megarad is seen.

TABLE

|  | RHBSOI | SIMOX |
| --- | --- | --- |
| Vt Shift @1 Mrad (Si) | −7.5 V | −13.5 V |

Although a specific embodiment of the invention has been disclosed, it will be understood by those having skill in the art, that changes can be made to that specific embodiment without departing from the spirit and scope of the invention.

What is claimed is:

1. A method of forming a silicon-on-insulator structure that is radiation hardened comprising the steps of:
   selecting a first silicon substrate;
   forming a oxide layer on the first silicon substrate;
   implanting ions to form recombination center generating impurities within the oxide layer;
   bonding a second silicon substrate to the implanted oxide layer to form a bonded substrate structure;
   annealing the bonded structure at a temperature of less than 850° C.;
   etching back the second silicon substrate to a desired thickness to form a silicon-on-insulator structure having radiation hardening.

2. The method of claim 1 wherein a cleaning step is performed prior to the bonding step.

3. The method of claim 1 wherein the implantation step is performed in two steps comprising a deep implant and a shallow implant to form a nearly uniform recombination center generating impurity profile.

4. The method of claim 1 wherein the oxide is thermally grown to a thickness range of 3500-4500 angstroms.

5. The method of claim 1 wherein the anneal is done at 800° C.

6. A method of forming a silicon-on-insulator structure that is radiation hardened comprising the steps of:
   selecting a first silicon substrate;
   growing a thermal oxide layer on the order of 4000 angstroms on a surface of the silicon substrate;
   ion implanting impurities into the oxide layer to form recombination center generating sites;
   selecting a second silicon substrate;
   cleaning the second silicon substrate;
   bonding the second silicon substrate to the oxide layer grown on the first silicon substrate;
   annealing the bonded structure at a temperature of less than 850° C.;
   etching back the second silicon substrate to a thickness range of 70-100 nm to form a silicon-on-insulator structure having radiation hardening.

7. A method of forming a silicon-on-insulator structure that is radiation hardened comprising the steps of:
   selecting a first and a second silicon substrate;
   oxidizing both first and second silicon substrates to form an oxide layer on a surface of the silicon substrates;
   implanting ions to form recombination center generating impurities in the oxide layers of both first and second silicon substrates;
   bonding the oxide layers of the first and second silicon substrates together to form a bonded substrate structure;
   annealing the bonded structure at a temperature of less than 850° C.;
   etching back the second silicon substrate to a desired thickness to form a silicon-on-insulator structure having radiation hardening.

8. The method of claim 1 wherein the implanted impurities are deep recombination center generating species, such as germaniam or arsenic.

* * * * *